United States Patent
Hennig et al.

(10) Patent No.: US 10,246,376 B2
(45) Date of Patent: Apr. 2, 2019

(54) LEAD-FREE PIEZOCERAMIC MATERIAL BASED ON BISMUTH SODIUM TITANATE (BST)

(71) Applicant: PI CERAMIC GMBH KERAMISCHE TECHNOLOGIEN UND BAUELEMENTE, Lederhose (DE)

(72) Inventors: Eberhard Hennig, Mörsdorf (DE); Antje Kynast, Leipzig (DE); Michael Töpfer, Arnstadt (DE); Michael Hofmann, Neustadt an der Orla (DE)

(73) Assignee: PI CERAMIC GMBH, Lederhose (DE)

( * ) Notice: Subject to any disclaimer, the term of this patent is extended or adjusted under 35 U.S.C. 154(b) by 532 days.

(21) Appl. No.: 14/909,821

(22) PCT Filed: Jun. 23, 2014

(86) PCT No.: PCT/EP2014/063132
§ 371 (c)(1),
(2) Date: Feb. 3, 2016

(87) PCT Pub. No.: WO2015/018558
PCT Pub. Date: Feb. 12, 2015

(65) Prior Publication Data
US 2016/0194249 A1    Jul. 7, 2016

(30) Foreign Application Priority Data

Aug. 7, 2013  (DE) .................. 10 2013 013 183
Jun. 16, 2014  (DE) .................. 10 2014 211 465

(51) Int. Cl.
*C04B 35/475* (2006.01)
*C04B 35/462* (2006.01)
(Continued)

(52) U.S. Cl.
CPC .......... *C04B 35/475* (2013.01); *C04B 35/462* (2013.01); *C04B 35/4682* (2013.01);
(Continued)

(58) Field of Classification Search
CPC . C04B 35/475; C04B 35/462; C04B 35/4682; C04B 35/62645;
(Continued)

(56) References Cited

U.S. PATENT DOCUMENTS

| 7,449,077 B2 | 11/2008 | Heinzmann et al. ...... 156/89.12 |
| 2002/0014196 A1 | 2/2002 | Takase et al. ...................... 117/1 |

(Continued)

FOREIGN PATENT DOCUMENTS

| DE | 19530592 A1 | 8/1996 | ............. C01G 29/00 |
| DE | 19530592 C2 | 2/1998 | ............. C01G 29/00 |

(Continued)

OTHER PUBLICATIONS

Mazumder, et al., "*Impedance and piezoelectric constants of phosphorous-incorporated Pb(Zr 0.52Ti 0.48)O 3 ceramics*", Materials Letters, North Holland Publishing Company, Amsterdam, NL, vol. 58, No. 25, 1. Oct. 1, 2004, pp. 3201-3205, XP004547930. Abstract and publication available at: https://www.researchgate.net/publication/251517717_Impedance_and_piezoelectric_constants_of_phosphorous-incorporated_PbZr_052Ti_048O_3_ceramics (last accessed: May 20, 2016) (copy not enclosed).

(Continued)

*Primary Examiner* — Thomas Dougherty
(74) *Attorney, Agent, or Firm* — Bodner & O'Rourke, LLP; Gerald T. Bodner; Christian P. Bodner

(57) ABSTRACT

The invention relates to a lead-free piezoceramic material based on bismuth sodium titanate (BST) having the following parent composition: $x(Bi_{0.5}Na_{0.5})TiO_3\text{-}yBaTiO_3\text{-}zSrTiO_3$ where $x+y+z=1$ and $0<x<1$, $0<y<1$, $0\leq z\leq 0.07$ or (Continued)

$x(Bi_{0.5}Na_{0.5})TiO_3$-$yBaTiO_3$-$zCaTiO_3$ where $x+y+z=1$ and $0<x<1$, $0<y<1$, $0<z\leq0.05$ or $x(Bi_{0.5}Na_{0.5})TiO_3$-$y(Bi_{0.5}K_{0.5})TiO_3$-$zBaTiO_3$ where $x+y+z=1$ and $0<x<1$, $0<y<1$, $0\leq z<1$, characterized by addition of a phosphorus-containing material in a quantity that gives a phosphorus concentration of from 100 to 2000 ppm in the piezoceramic material.

14 Claims, 16 Drawing Sheets

(51) Int. Cl.
- *C04B 35/468* (2006.01)
- *H01L 41/43* (2013.01)
- *H01L 41/083* (2006.01)
- *H01L 41/187* (2006.01)
- *C04B 35/626* (2006.01)
- *C04B 35/64* (2006.01)

(52) U.S. Cl.
CPC .. *C04B 35/62645* (2013.01); *C04B 35/62655* (2013.01); *C04B 35/62695* (2013.01); *C04B 35/64* (2013.01); *H01L 41/083* (2013.01); *H01L 41/187* (2013.01); *H01L 41/43* (2013.01); *C04B 2235/3201* (2013.01); *C04B 2235/3208* (2013.01); *C04B 2235/3213* (2013.01); *C04B 2235/3215* (2013.01); *C04B 2235/3298* (2013.01); *C04B 2235/42* (2013.01); *C04B 2235/447* (2013.01); *C04B 2235/727* (2013.01); *C04B 2235/768* (2013.01)

(58) Field of Classification Search
CPC ........ C04B 35/62655; C04B 35/62695; C04B 35/64; H01L 41/083; H01L 41/187; H01L 41/43
USPC ....... 310/358; 501/132; 252/62.9 PZ, 62.9 R
See application file for complete search history.

(56) References Cited

U.S. PATENT DOCUMENTS

| | | | | |
|---|---|---|---|---|
| 2006/0119229 | A1* | 6/2006 | Koizumi | H01L 41/43 310/358 |
| 2010/0187953 | A1* | 7/2010 | Ohnishi | H01L 41/0973 310/365 |
| 2015/0236239 | A1 | 8/2015 | Hennig et al. | 310/366 |

FOREIGN PATENT DOCUMENTS

| | | | |
|---|---|---|---|
| DE | 10234787 | 10/2003 | ........... H01L 41/047 |
| DE | 202012012009 | 2/2013 | ............. H01L 41/09 |
| EP | 1231192 | 8/2002 | ........... C04B 35/468 |
| JP | 2004075449 | 3/2004 | ............. C04B 35/46 |
| JP | 2009007181 | 1/2009 | ............. C04B 35/46 |
| JP | 2009007182 | 1/2009 | ............. C04B 35/46 |

OTHER PUBLICATIONS

English translation of the International Preliminary Report on Patentability (Chapter II of the Patent Cooperation Treaty), dated Feb. 7, 2016, the International Preliminary Report on Patentability (Chapter II of the Patent Cooperation Treaty), in German, dated Nov. 18, 2015, the Written Opinion of the International Searching Authority, in German, dated Aug. 6, 2014, and the International Search Report, in English, dated Aug. 6, 2014, which were issued by the International Bureau of WIPO in Applicant's corresponding international PCT application having Serial No. PCT/EP2014/063132, filed on Jun. 23, 2014.

* cited by examiner

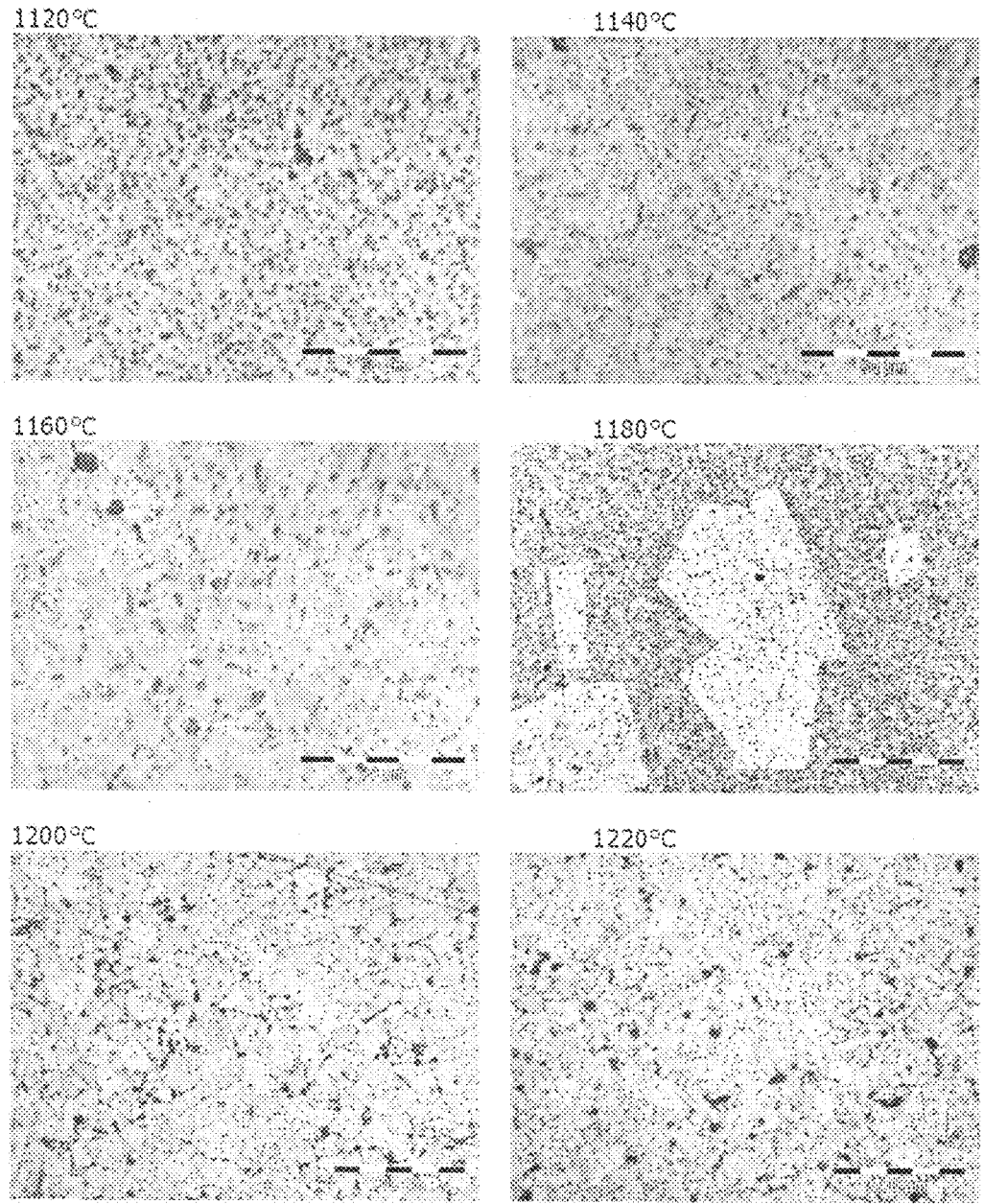
Fig. 3, samples 1a until 1f

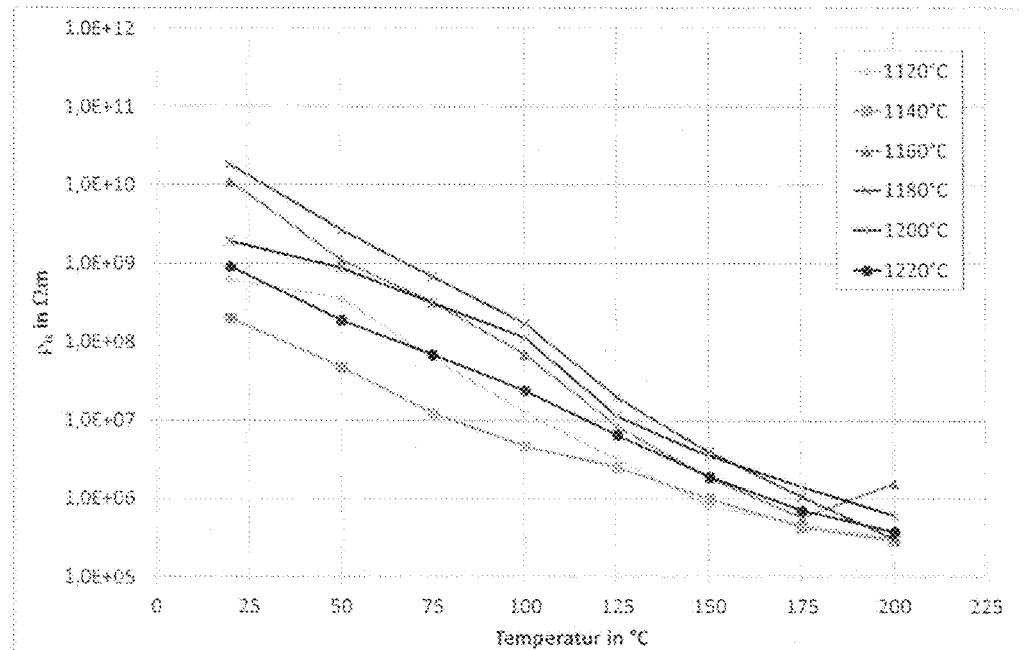
Fig. 4, samples 1a until 1f
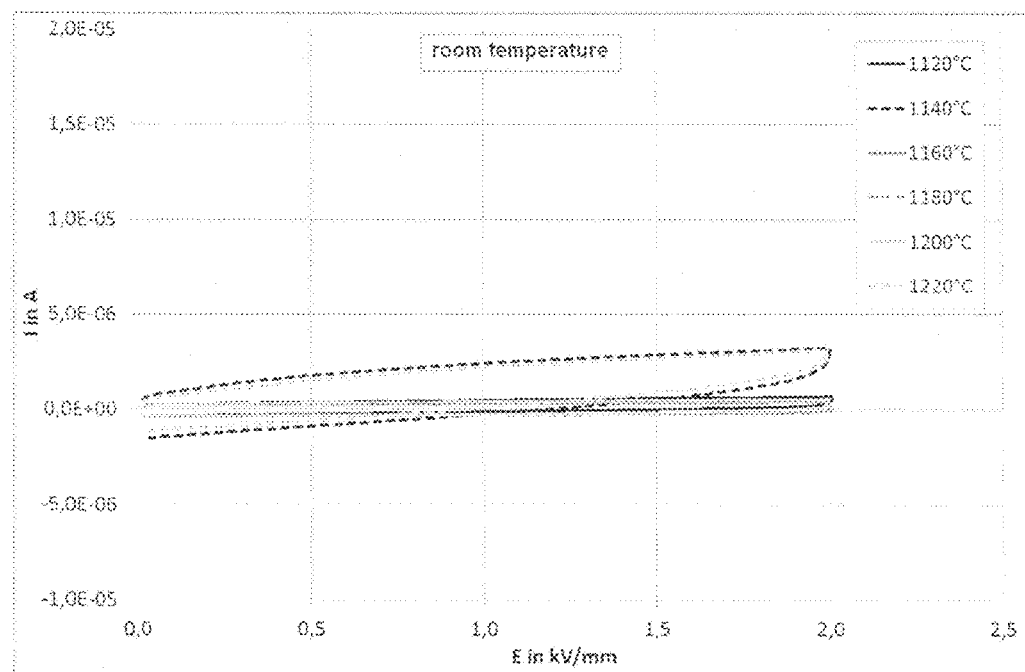
Fig. 5a, samples 1a until 1f

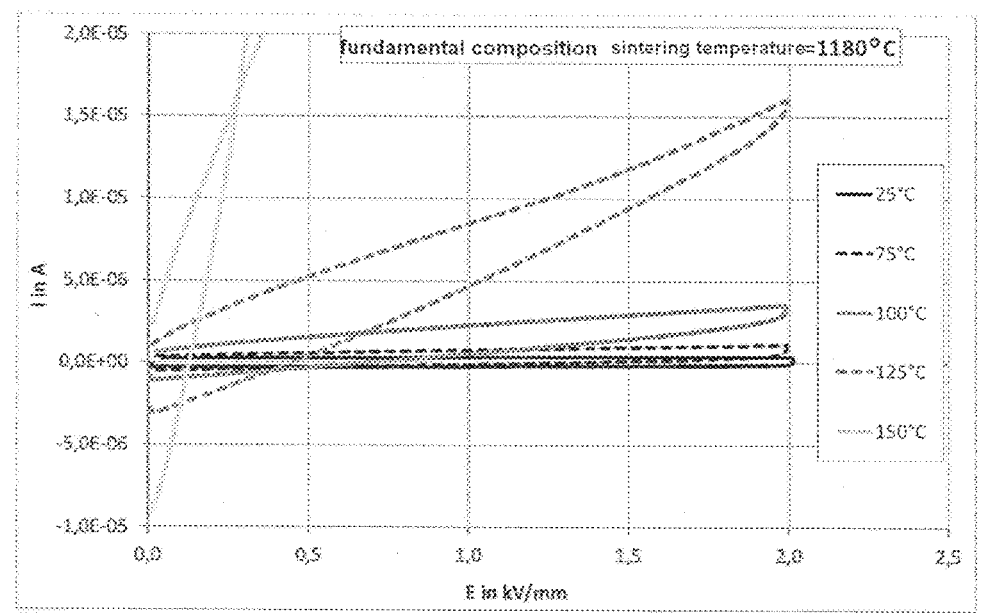
Fig. 5b, sample 1d

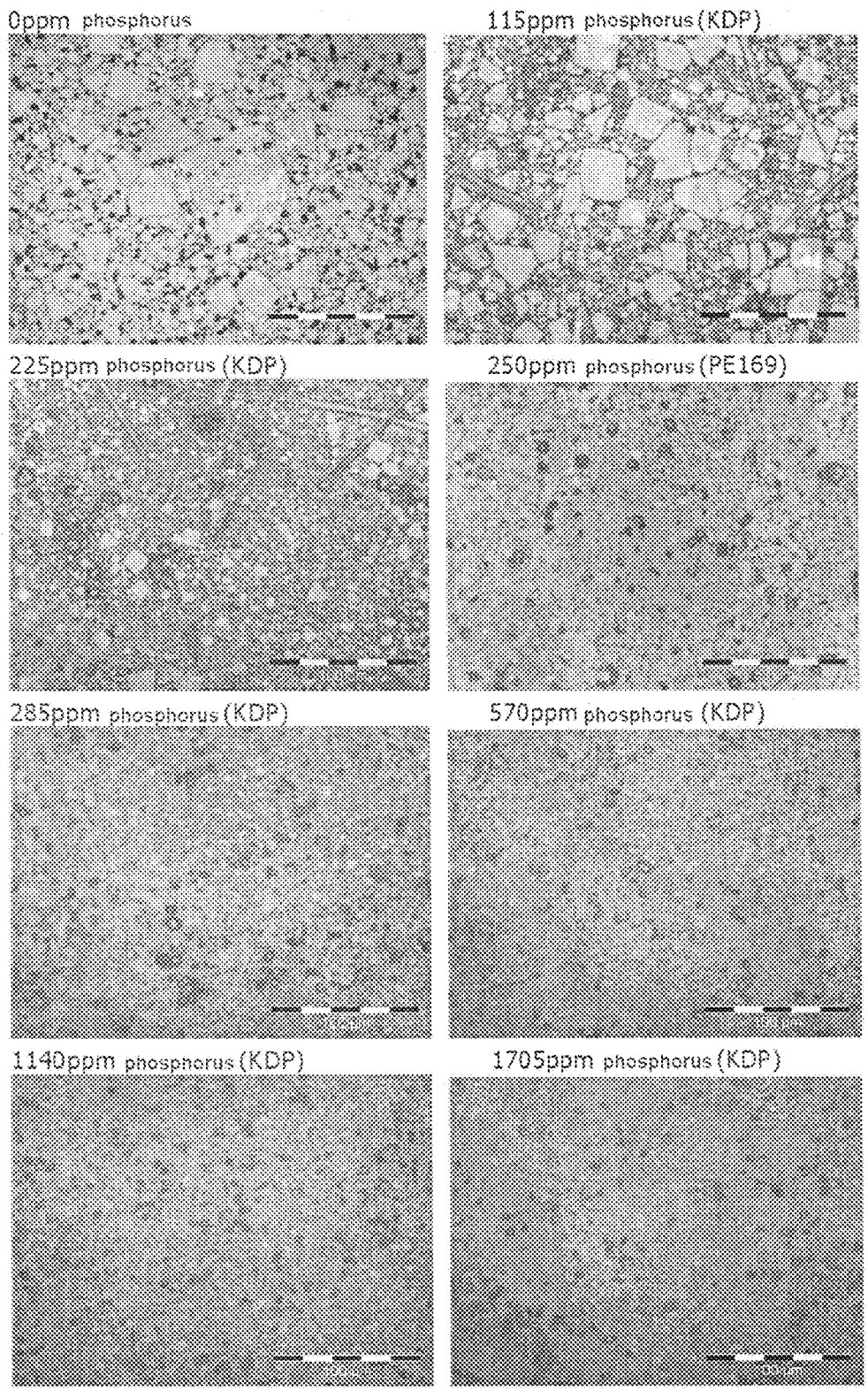
Fig. 7, samples 2a until 2h

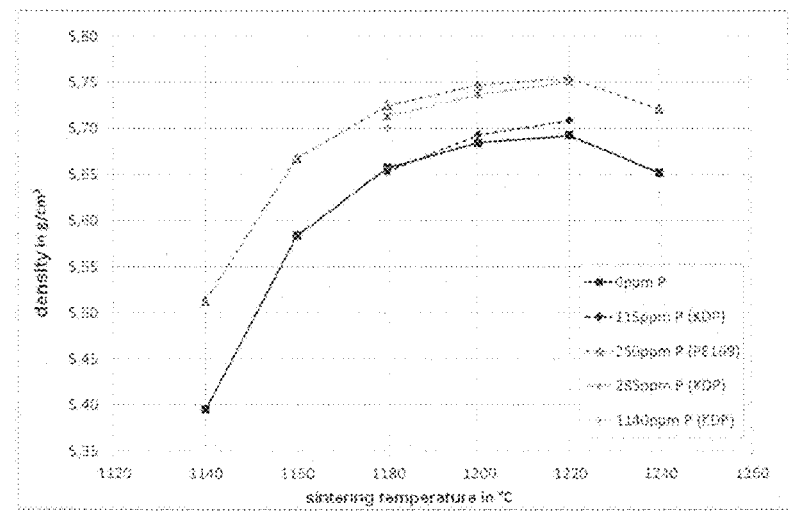
Fig. 8, samples 2a until 2c, 2e and 2g
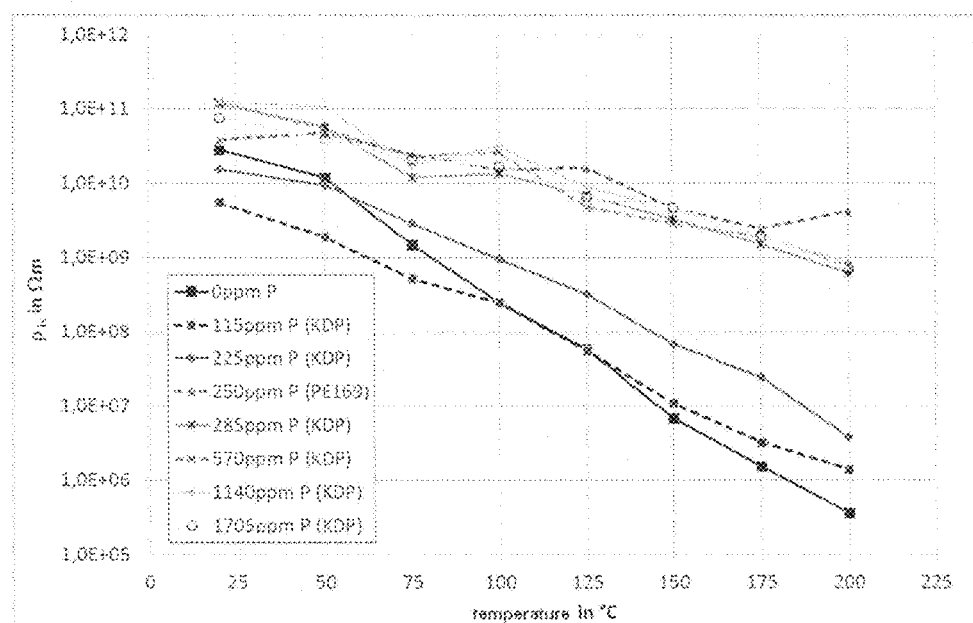
Fig. 9, samples 2a until 2h

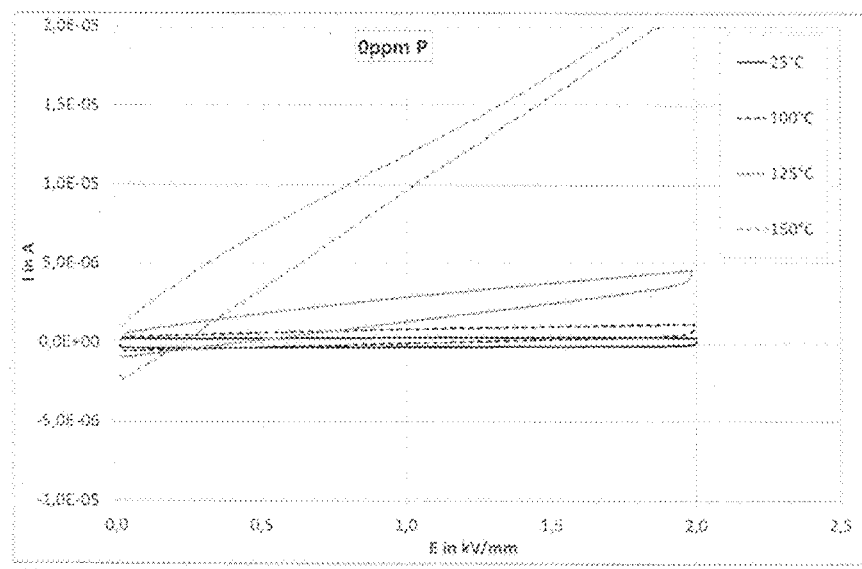
Fig. 10a, sample2a
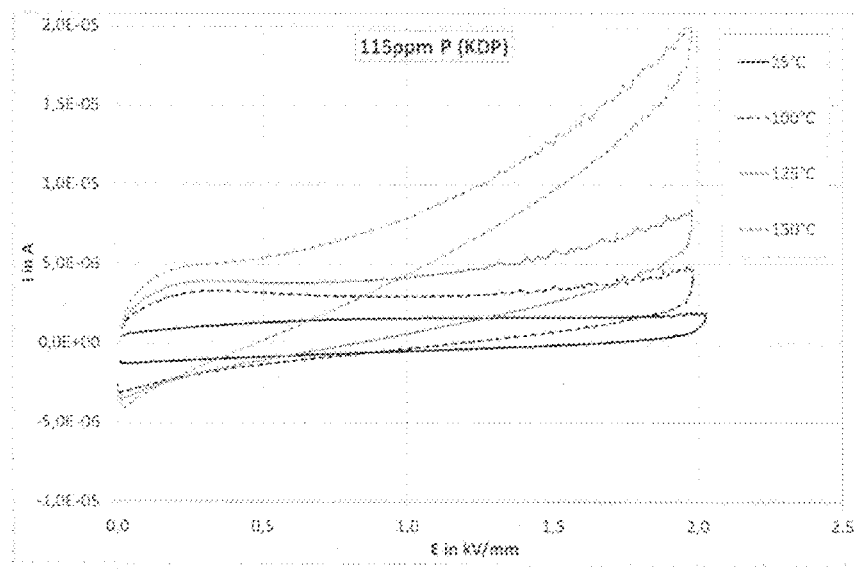
Fig. 10b, sample2c

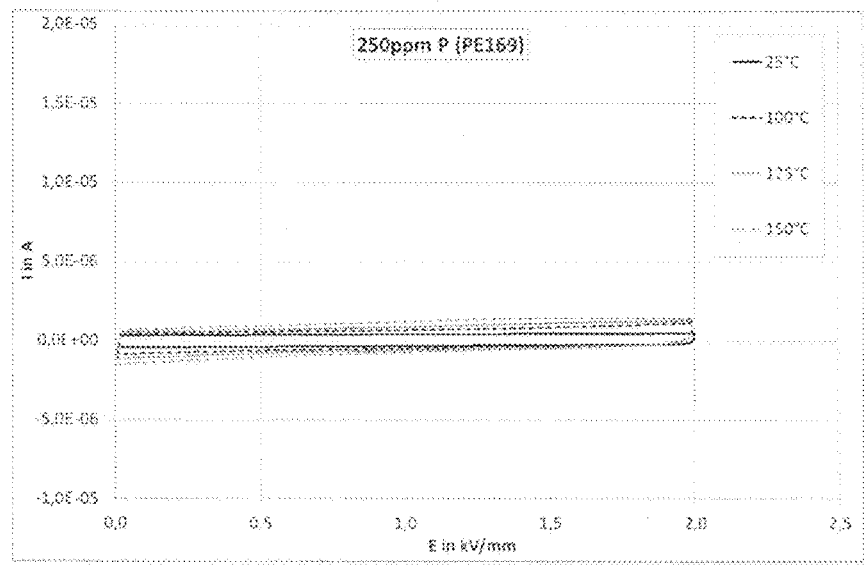
Fig. 10c, sample 2b
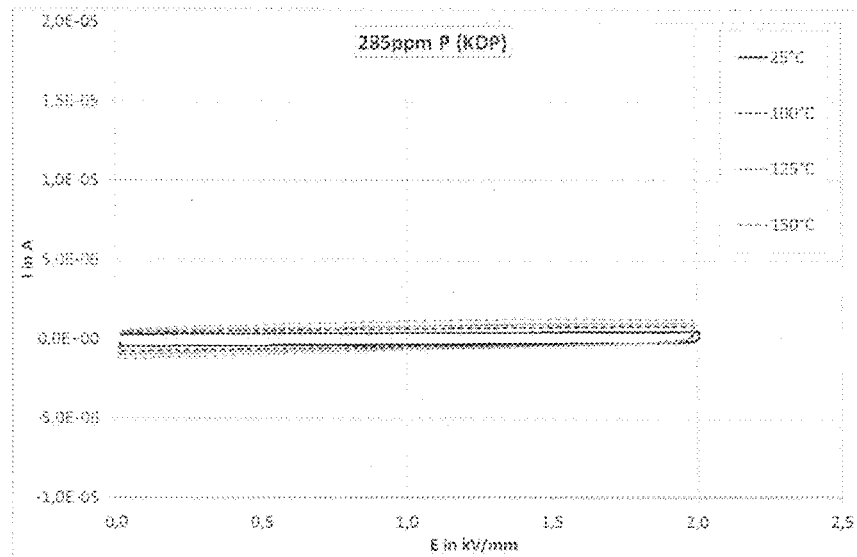
Fig. 10d, sample 2e

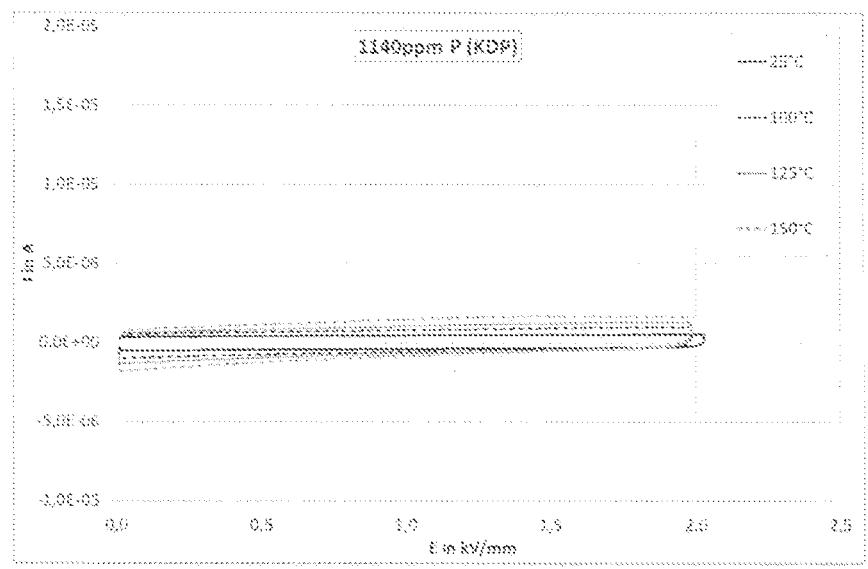
Fig. 10e, sample2g

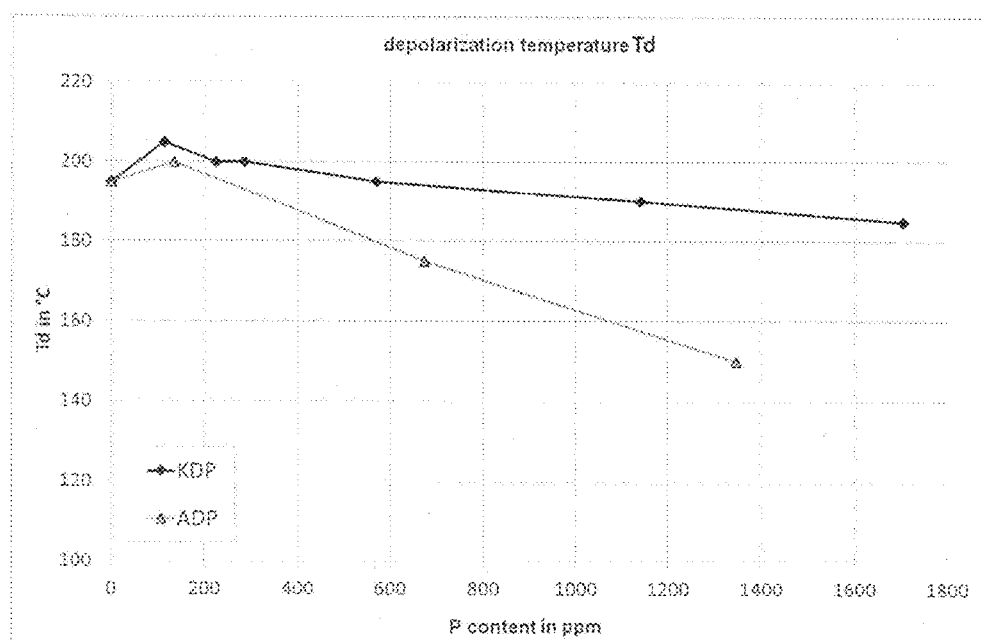
Fig. 12, samples 2a, 2c until 2h, 2j until 2l

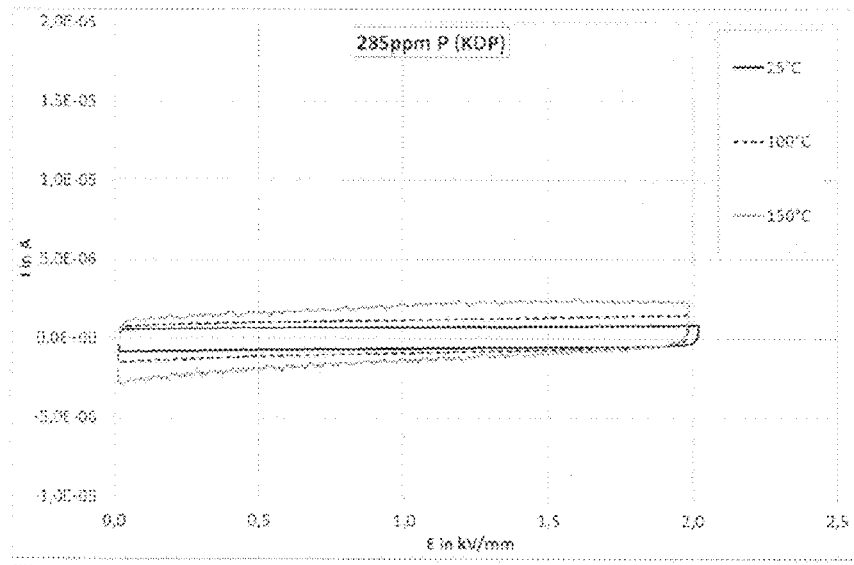
Fig. 13, sample 3
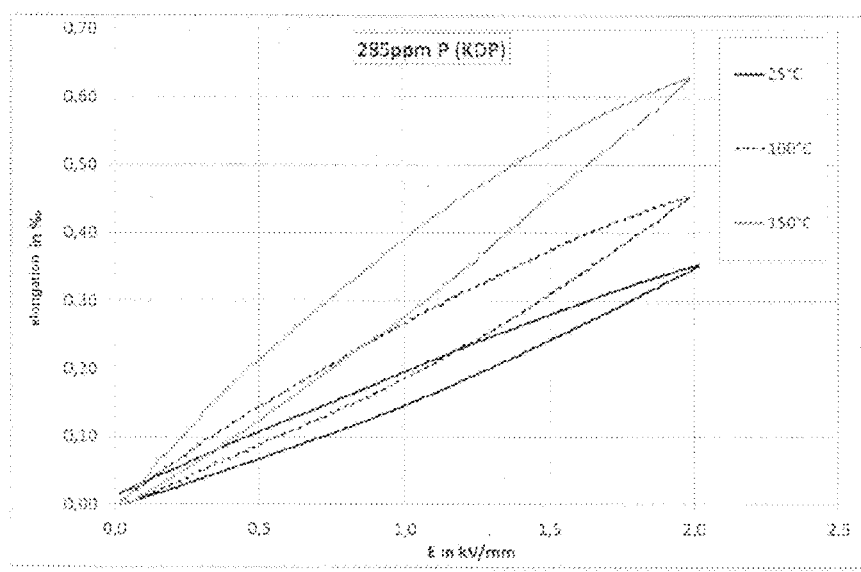
Fig. 14, sample 3

LEAD-FREE PIEZOCERAMIC MATERIAL BASED ON BISMUTH SODIUM TITANATE (BST)

The invention relates to a lead-free piezoceramic material based on bismuth sodium titanate (BST) of a defined fundamental composition according to the preamble of claim 1, and in particular a lead-free material in the meaning of the RoHS directive (guideline 2011/65/EU) having a lead content in the homogeneous material <0.1 wt. %.

Piezoactuators, piezosensors, and other piezoelectric components based on lead zirconate titanate (PZT) represent the present prior art, wherein the requirement increasingly exists of making piezoceramic materials lead-free.

In a refinement of the prior art, attempts have been made to make lead-free piezoceramic materials based on BST (bismuth sodium titanate).

These materials have been known for some time and fundamental compositions are described in JP 62202576 (BST-BT and BST-BKT) and DE 19530592 C2 (BST-BT-CT). A modification of these materials using, for example, strontium titanate has been comprehensively described by Takenaka (Sensor and Materials; 3 (1988) 123-131).

Building on these fundamental studies, further embodiments have been described in the prior art. Reference is made in this regard, for example, to US 2002/014196 A1 and EP 1231192 A1.

A fundamental problem of all BST-based compositions is very poor compaction during the sintering and the occurrence of so-called giant grain growth linked to high conductivity. Piezoceramic bodies having an inhomogeneous structure may be polarized poorly, so that the desired material properties are not achieved or excessively high levels of variation occur in the material properties. Proposals were presented in JP 2004-075449 for suppressing giant grain growth by targeted substitution by manganese, chromium, iron, cobalt, or niobate.

Our own studies with respect to BST material modifications using manganese and copper did show partial improvements in the sintering behavior, but still showed an uninterrupted tendency toward giant grain growth and worsening of electrical data.

It is thus to be stated that modified BST compositions tend toward giant grain growth which is inhomogeneously distributed in the material or toward the formation of a coarse-grained structure. In this case, the occurrence of giant grains is uncontrollable and is strongly dependent on the preparation and sintering conditions. The grain growth can be suppressed by low sintering temperatures, which results in a low sintering density of <5.6 g/cm$^3$, however. The consequences of the undesired giant grain growth or of the coarse-grained structure are low and strongly temperature-dependent specific electrical insulation resistance, poor polarizability of the ceramic body, and disturbed oscillation behavior of the thickness oscillation in the megahertz range.

In our own studies, it was additionally found that the leakage current is extremely dependent on the structure and the temperature.

Moreover, it is to be stated that modified BST compositions often have a small sintering interval, which results in technical problems which are difficult to control. Sintering interval is understood as the range, which is bounded by two temperature specifications, and within which the required properties of the ceramic are achieved during the firing of the material. A small sintering interval therefore has the result that the desired properties of the piezoceramic materials are only achieved if very small temperature tolerances can be used during the firing, which is technologically difficult to control. A small sintering interval therefore results in economic disadvantages, since a relatively high proportion of the production is discards.

From the above-mentioned statements, it is the object of the invention to specify a lead-free piezoceramic material based on BST, which displays a homogeneous, fine-grained structure and has a specific electrical insulation resistance at a temperature of 150° C. of ≥5*10$^8$Ω. A further object of the invention is to specify a lead-free piezoceramic material based on BST, which has a large sintering interval, in particular a sintering interval of ≥40 K.

The object of the invention is achieved by the combination of features according to claim 1, and a method for producing a corresponding piezoceramic material, and by a piezoceramic body or multilayer actuator produced on the basis of the material according to the invention.

It is accordingly based upon a lead-free piezoceramic material based on bismuth-sodium-titanate of the fundamental composition

| | |
|---|---|
| $x(Bi_{0.5}Na_{0.5})TiO_3—yBaTiO_3—zSrTiO_3$ and | with x + y + z = 1, 0 < x < 1, 0 < y < 1, 0 ≤ z ≤ 0.07 |
| preferably | 0 < x < 1, 0.1 < y < 0.25, 0 ≤ z ≤ 0.07 |
| more preferably | 0 < x < 1, 0.1 ≤ y ≤ 0.20, 0 ≤ z ≤ 0.03 |
| or $x(Bi_{0.5}Na_{0.5})TiO_3—yBaTiO_3—zCaTiO_3$ and | with x + y + z = 1, 0 < x < 1, 0 < y < 1, 0 ≤ z ≤ 0.05 |
| preferably | 0 < x < 1, 0.1 < y < 0.25, 0 ≤ z ≤ 0.05 |
| more preferably | 0 < x < 1, 0.1 ≤ y ≤ 0.20, 0 ≤ z ≤ 0.02 |
| or $x(Bi_{0.5}Na_{0.5})TiO_3—y(Bi_{0.5}K_{0.5})TiO_3—zBaTiO_3$ and | with x + y + z = 1, 0 < x < 1, 0 < y < 1, 0 ≤ z ≤ 1 |
| preferably | 0 < x < 1, 0.1 < y < 0.3, 0 ≤ z ≤ 0.15 |
| more preferably | 0 < x < 1, 0.1 ≤ y ≤ 0.24, 0 ≤ z ≤ 0.05. |

By adding a phosphoric material in a quantity such that the concentration of phosphor in the piezoceramic material is 100 to 2000 ppm, a piezoceramic material according to the invention is obtained.

According to the invention, the object is achieved by a lead-free piezoceramic material based on bismuth sodium titanate (BST) of the fundamental composition

| | |
|---|---|
| $x(Bi_{0.5}Na_{0.5})TiO_3—yBaTiO_3—zSrTiO_3$ and | with x + y + z = 1, 0 < x < 1, 0 < y < 1, 0 ≤ z ≤ 0.07 |
| preferably | 0 < x < 1, 0.1 < y < 0.25, 0 ≤ z ≤ 0.07 |
| more preferably | 0 < x < 1, 0.1 ≤ y ≤ 0.20, 0 ≤ z ≤ 0.03 |
| or $x(Bi_{0.5}Na_{0.5})TiO_3—yBaTiO_3—zCaTiO_3$ and | with x + y + z = 1, 0 < x < 1, 0 < y < 1, 0 ≤ z ≤ 0.05 |
| preferably | 0 < x < 1, 0.1 < y < 0.25, 0 ≤ z ≤ 0.05 |
| more preferably | 0 < x < 1, 0.1 ≤ y ≤ 0.20, 0 ≤ z ≤ 0.02 |
| or $x(Bi_{0.5}Na_{0.5})TiO_3—y(Bi_{0.5}K_{0.5})TiO_3—zBaTiO_3$ and | with x + y + z = 1, 0 < x < 1, 0 < y < 1, 0 ≤ z ≤ 1 |

| | |
|---|---|
| preferably | $0 < x < 1$, $0.1 < y < 0.3$, $0 \leq z \leq 0.15$ |
| more preferably | $0 < x < 1$, $0.1 \leq y \leq 0.24$, $0 \leq z \leq 0.05$ | characterized by the addition of a phosphoric material in a quantity such that the concentration of phosphorus in the piezoceramic material is 100 to 2000 ppm.

The specification ppm (parts per million) relates in this case to the mass of phosphorus in relation to the total mass of the piezoceramic composition.

In one preferred embodiment, the piezoceramic material according to the invention has a lead content of <0.1 wt. %.

In one preferred embodiment, the piezoceramic material based on bismuth sodium titanate (BST) according to the invention is embodied so that it has the fundamental composition

| | |
|---|---|
| $x(Bi_{0.5}Na_{0.5})TiO_3$—$yBaTiO_3$—$zSrTiO_3$ | with $y \geq 0.1$ and $x + y + z = 1$ or |
| $x(Bi_{0.5}Na_{0.5})TiO_3$—$yBaTiO_3$—$zCaTiO_3$ | with $y \geq 0.1$ and $x + y + z = 1$ or |
| $x(Bi_{0.5}Na_{0.5})TiO_3$—$y(Bi_{0.5}K_{0.5})TiO_3$—$zBaTiO_3$ | with $y \geq 0.1$ and $x + y + z = 1$, | wherein an addition of a phosphoric material is performed in a quantity such that the concentration of phosphorus in the piezoceramic material is 100 to 2000 ppm.

In one preferred embodiment, the lead-free piezoceramic material is embodied so that the phosphoric compound is an inorganic phosphate, hydrogen phosphate, or dihydrogen phosphate.

In a particularly preferred embodiment, the lead-free piezoceramic material is embodied so that the phosphoric compound is selected from the group which consists of $KH_2PO_4$ (KDP) and $(NH_4)H_2PO_4$ (ADP).

While the effect according to the invention of the addition of the phosphoric material is achieved in a broad quantity range, it has been shown that particularly advantageous properties are achieved if the lead-free piezoceramic material is embodied so that the phosphoric material is added in a quantity such that the concentration of phosphorus in the lead-free piezoceramic material is 100 to 2000 ppm.

It has been shown that if the concentration of phosphorus in the ceramic material according to the invention exceeds 2000 ppm, the ability to process the material mixture to form the piezoceramic material worsens. At concentrations of less than 100 ppm, the effect sought according to the invention is no longer achieved to a sufficient extent.

In one preferred embodiment, the phosphoric material is used in a quantity such that the concentration of phosphorus in the lead-free piezoceramic material is 250 to 2000 ppm, more preferably 270 to 1800 ppm.

It has been shown that the properties of the lead-free piezoceramic material can be influenced in a particularly advantageous manner in that the fundamental composition contains additives in the form of oxides or complex perovskites.

It is surprisingly possible using the lead-free piezoceramic material according to the invention to set the sintering interval to $\geq 40$ K.

The invention also relates to a method for producing the various lead-free piezoceramic materials. The method according to the invention is preferably embodied so that it comprises the following steps:

producing a raw material mixture of the fundamental composition, producing a calcinate of the fundamental composition, finely grinding the calcinate, producing a granulate in particular by spray granulation or producing a casting slurry for the multilayer or "cofiring" process, further processing in a known manner including sintering in normal atmosphere.

A "cofiring" process is to be understood in the meaning of the present invention as a particularly innovative production method, in which films made of piezoceramic material are firstly cast and subsequently are provided with electrodes while still in the green state. A piezoelement is laminated from many individual films and subsequently sintered jointly with the internal electrodes in a single processing step, as described, for example, in DE 10234787.

The addition of phosphorus or phosphoric materials can be performed during the fine grinding and/or the preparation of a spray slurry or casting slurry.

The method according to the invention is particularly preferably embodied so that the addition of phosphorus or phosphoric materials takes place during the preparation of the spray slurry or casting slurry. This method has the advantage that firstly a large-scale industrial production of a finely-ground powder of the fundamental composition takes place and the quantity and type of the phosphorus addition can be adapted to the requirements of the subsequent processing steps (spray slurry, casting slurry).

In one particularly preferred method for producing the lead-free piezoceramic material according to the invention, a calcinate of the fundamental composition is firstly provided. An addition of phosphorus is then performed, preferably in the form of KDP or ADP, which are ferroelectric as a single crystal, in a concentration of 270 to 1800 ppm. The addition can be performed during the fine grinding or during the preparation of the spray slurry or casting slurry. The further processing of the material of this type, including sintering in normal atmosphere, is performed according to known technologies.

In addition, a piezoceramic multilayer actuator based on the above-described piezoceramic material is according to the invention. Such a piezoceramic multilayer actuator is known, for example, from DE 10234787 or DE 20 2012012009.

The invention also relates to a piezoelectric component based on the above-described piezoceramic material, which consists of at least one piezoceramic body having at least two electrodes, and in particular also to a piezoelectric ultrasonic transducer, which is operated in particular in its thickness oscillation.

The phosphoric material used can be understood as a sintering aid, wherein the phosphorus component is decisively important here. The prejudice of the technical world, according to which phosphorus—although it does inhibit the grain growth in a positive manner—worsens the piezoelectric properties of corresponding piezoceramic materials, is overcome by the targeted addition of phosphorus to the BST fundamental composition.

Surprisingly, it has been shown that by the use of the phosphoric material, not only can effective suppression of the giant grain growth and therefore a homogeneous, fine-grained structure be achieved, but rather a broad sintering interval of $\geq 40$ K the piezoceramic material is also achieved at the same time. This is of great significance technologically, because a broad sintering interval is a prerequisite for cost-effective production of the material, multilayer actuator, or component. In addition, the piezoceramic materials according to the invention have a high specific electrical insulation resistance of $\geq 5*10^8 \Omega$, which is very advantageous for the use in the described components.

With the piezoceramic material according to the invention, a homogeneous, fine-grained structure results in a broad sintering interval of $\geq 40$ K, in the temperature range from 1120° C. to 1240° C. In addition, an increase of the insulation resistance at high temperatures and therefore better polarization behavior are to be noted as advantages. An actuator produced on the basis of the lead-free piezoceramic material according to the invention has a high insulation resistance over a broad temperature range, while an ultrasonic transducer according to the invention has pronounced thickness oscillation with high coupling factor.

It remains to be noted that surprisingly the use of phosphoric additives results in an inhibition of the giant grain growth and a homogeneous, fine-grained structure, and the location of the depolarization temperature can be influenced within certain limits by the type and quantity of the phosphorus addition.

Phosphoric additives can be added during the fine grinding or the spray granulation. However, the use of phosphoric dispersing agents and/or additives during the preparation of casting slurries or the use of phosphoric binders during the preparation of such slurries is also conceivable.

With suitable selection of the phosphoric dispersing agents and/or additives, the technical advantage results that the viscosity of finely ground, casting, or spray slurry is not negatively influenced.

In addition, a phosphorus introduction can be used which is substantially greater than the value introduced by typical raw material contamination and typical dispersing agent concentrations and in the case of which the added phosphorus quantity can be set in a targeted manner.

One possible alternative is the phosphorus addition during the raw material mixing or an infiltration of solids using phosphoric liquids. However, it is also conceivable to incorporate phosphorus as an acceptor dopant in the fundamental composition (partial replacement of titanium by phosphorus).

It has been shown that the addition of the phosphorus to the material according to the invention can be performed in the form of nearly any arbitrary phosphoric material. Although potassium dihydrogen phosphate or ammonium dihydrogen phosphate are particularly preferred phosphoric materials, the addition of phosphorus can also be performed by arbitrary other phosphoric materials.

The inventors of the present application have established by their studies that a certain reduction of the depolarization temperature accompanies the addition of the phosphoric material. The effect of the reduction of the depolarization temperature is different in this case for different phosphoric materials. It has thus been shown that, for example, if ammonium dihydrogen phosphate is added, a substantially stronger drop of the depolarization temperature occurs than upon the addition of potassium dihydrogen phosphate. This unexpected effect has the result that the present invention has the further advantage that the reduction of the depolarization temperature can be controlled within certain limits by the selection of the additional phosphoric material, with otherwise uniform properties of the piezoceramic material. This is significant because a specific depolarization temperature is sought in dependence on the desired intended use of the piezoceramic material. While it generally appears desirable to seek the smallest possible reduction of the depolarization temperature, it can be entirely useful for specific applications to achieve a stronger reduction of the depolarization temperature. This applies in particular for intended uses in which the piezoceramic materials only have to be functional in a very narrow temperature interval. For such applications, it can be entirely reasonable to seek a stronger reduction of the depolarization temperature, since the desirable piezoelectric properties of the piezoceramic materials improve upon the approach to the depolarization temperature from below.

The invention additionally also relates to the use of a phosphoric material in a piezoceramic material based on bismuth sodium titanate (BST) of the above-mentioned fundamental composition to reduce the giant grain growth and to achieve a homogeneous, fine-grained structure, wherein the phosphoric material is used in a quantity such that the concentration of phosphorus in the piezoceramic material is 100 to 2000 ppm, in particular 250 to 2000 ppm, more preferably 270 to 1800 ppm. The invention will be explained in greater detail hereafter on the basis of an exemplary embodiment and the description of comparative experiments.

BRIEF DESCRIPTION OF THE SEVERAL VIEWS OF THE DRAWINGS(S)

FIGS. 2 and 3 are a graph showing the curve of the sintering density for the fundamental composition 0.85 $(Bi_{0.5}Na_{0.5})TiO_3$ -$0.12BaTiO_3$ - $0.03SrTiO_3$ in dependence on the sintering temperature and the corresponding light microscopy structure recordings, respectively.

FIG. 4 is a graph illustrating the extreme drop of the insulation resistance with the sample temperature.

FIGS. 5a and 5b are graphs showing the electrical conductivity versus electrical field strength of samples at various temperatures.

FIG. 7 is a series of light microscopy structure recordings of samples 2a to 2h.

FIG. 8 is a graph showing the curve of the sintering density in dependence on the sintering temperature of samples 2a to 2c, 2e and 2g.

FIG. 9 is a graph showing the substantial increase of the specific insulation resistance of samples 2a to 2h at higher temperatures.

FIGS. 10a-10e are graphs showing the electrical conductivity versus electrical field strength of samples containing various concentrations of phosphorous at various temperatures.

FIG. 12 is a graph showing the depolarization temperature Td for different phosphorus sources and proportions.

FIGS. 13 and 14 are graphs showing the electromechanical elongation and the sample current in the temperature range from 25 to 150° C. for a composition according to the present invention.

EXAMPLES

The measurement results set forth hereafter relate to the fundamental system $x(Bi_{0.5}Na_{0.5})TiO_3$-$yBaTiO_3$-$zSrTiO_3$.

Figure 1:
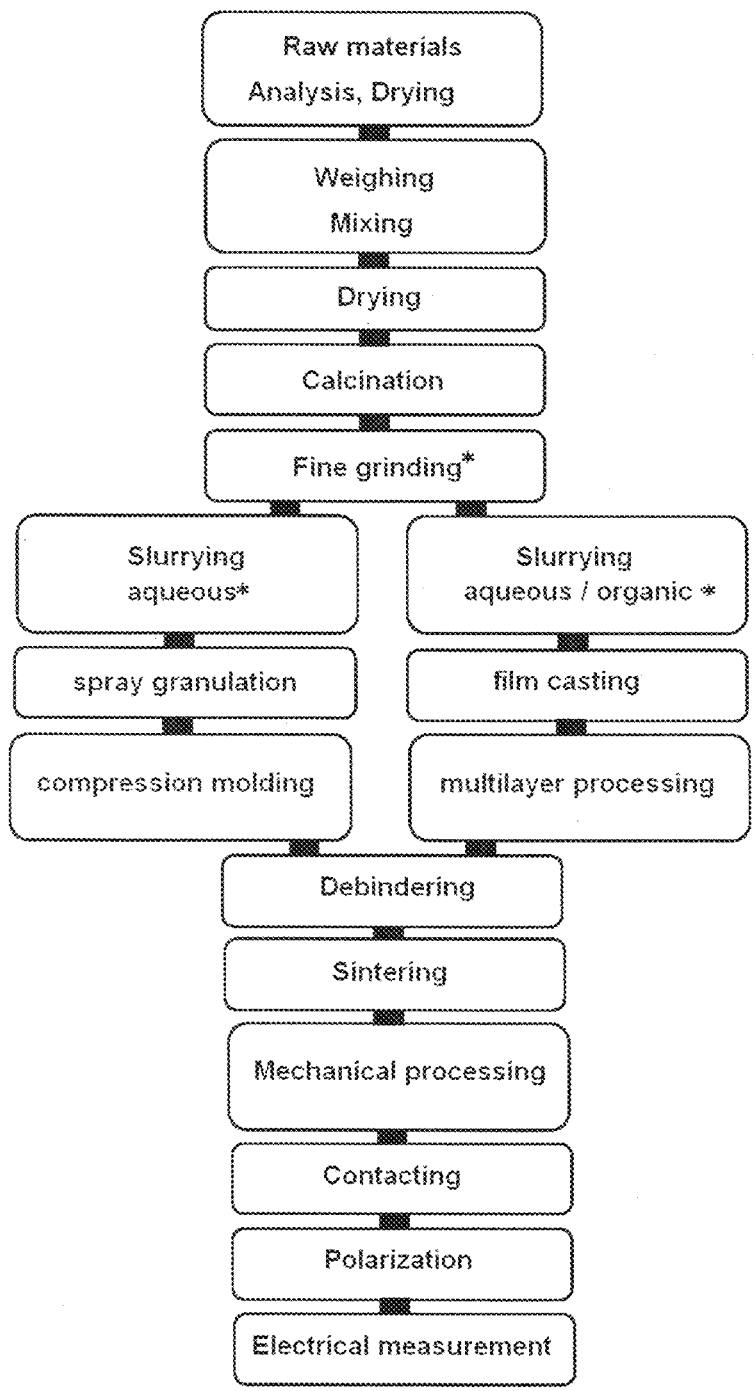
FIG. 1 is a flow chart illustrating one embodiment of the method for producing a lead-free piezoceramic material of the present invention.

FIG. 1 describes the general technological sequence of the sample production. The technological steps in which the addition of phosphoric materials as described in the claims can be performed are identified with "*".

The mixing of the raw materials and the fine grinding of the calcinate were each performed in an agitator bead mill.

Phosphoric additions were performed specifically during the following technological steps:

| | |
|---|---|
| FM | fine grinding |
| G | addition during the granulation |
| VS | addition during the organic slurrying for the film production |

The structure characterization was performed according to the following classification:

| | |
|---|---|
| 0 | material not processable |
| 1 | fine-grained, homogeneous structure |
| 2 | inhomogeneous structure, giant grain growth |
| 3 | coarse-grained structure |

The sample density was determined on sintered cylinders according to the buoyancy method and is specified either as a mean value for the specified sintering temperature or as the "density in g/cm³>" for the lowest sintering temperature having measurable electrical values in the specified temperature range.

For the electrical measurements, metallized samples having a diameter of 12 mm, an insulation edge of 0.5 mm, and a thickness of 0.5 mm were used. The polarization was performed at 80° C., 15 minutes, 5 kV/mm.

Samples having strong variation of the measured values, disturbance of the resonance curves, or excessively low maximum phase angle in the radial or thickness oscillation are identified by "S".

The coupling factors of the radio and thickness oscillation are $k_p$ and $k_t$, respectively.

The depolarization temperature $T_d$ is generally defined as the inflection point in the temperature dependence of the dielectric constant of polarized samples.

The specific insulation resistance $\rho_{is}$ is determined at 50 V on polarized samples with temperature increase from room temperature up to 200° C.

The electromechanical elongation $S_3$ is determined by means of laser interferometer at 2 kV/mm. The value at room temperature and the associated sample current I are specified in the table.

Characteristic values in the studied temperature range are shown in Table 2.

The diagrams and light microscopy structure recordings relate to the composition defined in the table under the respective sample number.

The prior art and the deficiencies to be remedied are to be described in greater detail hereafter:

TABLE 1

| No. | x | y | z | ρ in ppm | sintering temperature ° C. | Density in g/cm³ | Structure | S | ε |
|---|---|---|---|---|---|---|---|---|---|
| 1a | 0.850 | 0.120 | 0.030 | 0 | 1120 | 5.2 | 1 | | 460 |
| 1b | 0.850 | 0.120 | 0.030 | 0 | 1140 | 5.5 | 1 | S | 570 |
| 1c | 0.850 | 0.120 | 0.030 | 0 | 1160 | 5.6 | 1 | | 530 |
| 1d | 0.850 | 0.120 | 0.030 | 0 | 1180 | 5.7 | 2 | | 590 |
| 1e | 0.850 | 0.120 | 0.030 | 0 | 1200 | 5.7 | 3 | S | 480 |
| 1f | 0.850 | 0.120 | 0.030 | 0 | 1220 | 5.7 | 3 | S | 480 |

| No. | tanδ × 10³ | kp | kt | Td in ° C. | $\rho_{is}$ in Ωm (RT) | $\rho_{is}$ in Ωm (150° C.) | RT, 2 kV/mm S3 × 10³ | RT, 2 kV/mm I in A |
|---|---|---|---|---|---|---|---|---|
| 1a | 16 | 0.12 | 0.37 | 215 | 6.1E+08 | 8.0E+05 | 0.25 | 6.9E−07 |
| 1b | 119 | 0.10 | 0.21 | 210 | 2.0E+08 | 1.0E+06 | 0.19 | 3.2E−06 |
| 1c | 13 | 0.12 | 0.40 | 210 | 1.1E+10 | 1.8E+06 | 0.23 | 3.8E−07 |
| 1d | 16 | 0.13 | 0.41 | 210 | 1.8E+10 | 4.0E+06 | 0.27 | 4.1E−07 |
| 1e | 44 | 0 | 0 | 220 | 1.9E+09 | 3.6E+06 | 0.31 | 5.5E−07 |
| 1f | 79 | 0 | 0 | 230 | 9.1E+08 | 1.9E+06 | 0.32 | 3.1E−07 |

Figure 2:
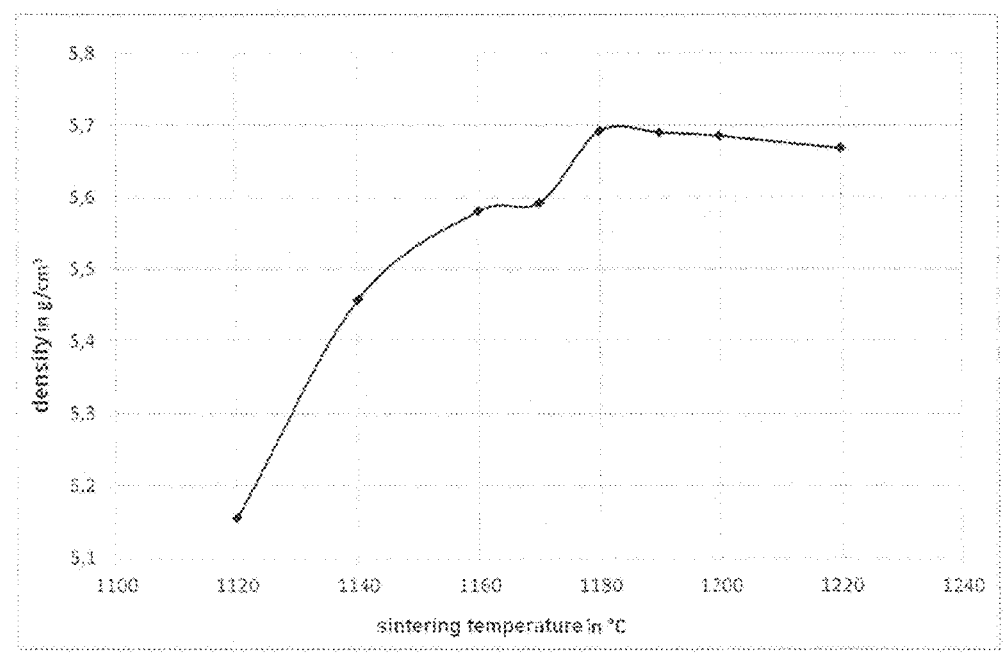

FIG. 2, samples 1a to 1f from Table 1, shows the curve of the sintering density for the fundamental composition 0.85 $(Bi_{0.5}Na_{0.5})TiO_3$-$0.12BaTiO_3$-$0.03SrTiO_3$ in dependence on the sintering temperature. The low density at low sintering temperatures, the narrow sintering interval, and the drop of the density at high sintering temperatures caused by the decomposition of the samples (vaporization Bi, Na) are characteristic.

The corresponding light microscopy structure recordings (FIG. 3) show the transition from the fine-grained, insufficiently compacted material to the giant grain growth in the middle of the studied temperature range and to coarse-grained structure at higher sintering temperatures.

The extreme drop of the insulation resistance with the sample temperature has proven to be disadvantageous (FIG. 4, samples 1a to 1f). The results are insufficient or undefined polarization and excessively low or strongly varying electrical values.

The non-tolerable electrical conductivity is clearly recognizable in the depiction of the sample current at higher electrical field strengths and higher temperatures (FIG. 5a, samples 1a to 1f, 5b, sample 1d). The operating temperature of actuators is thus significantly restricted.

Figure 6:
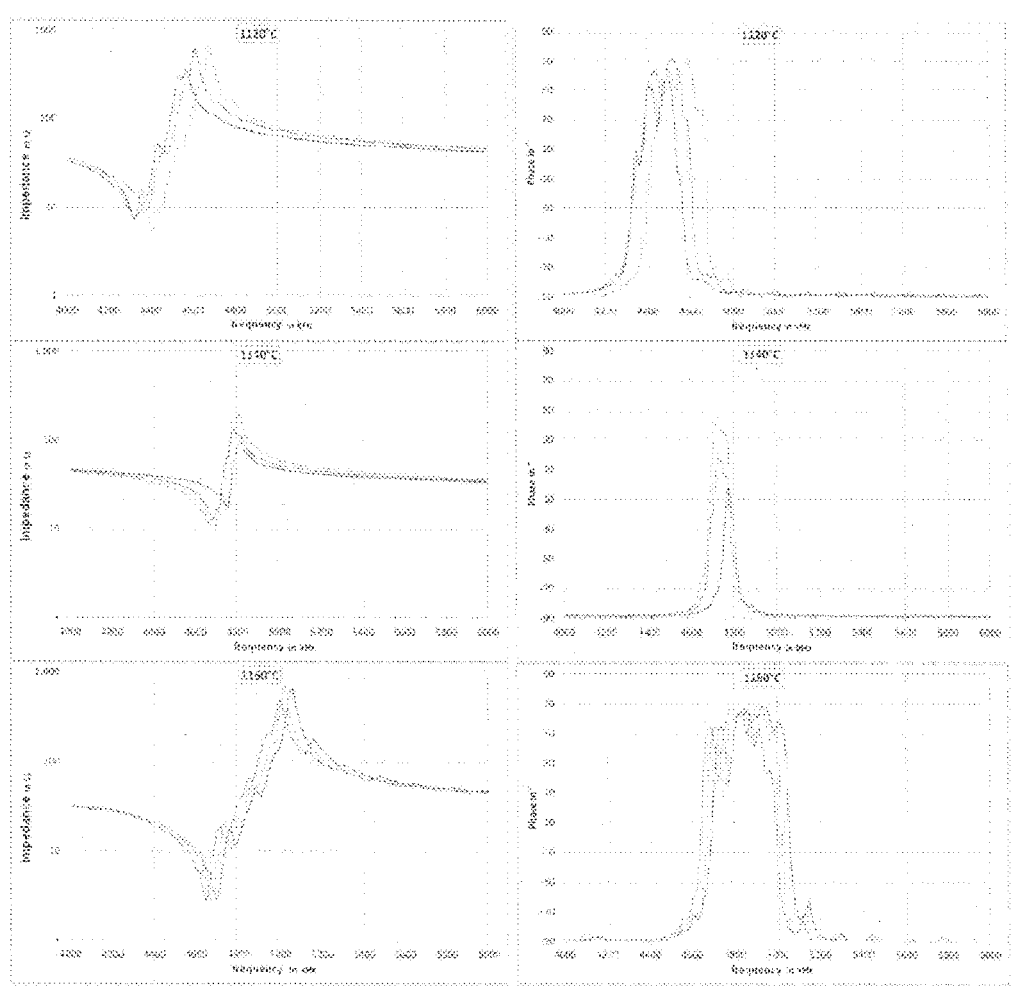
FIG. 6 are graphs which depict the curve of impedance and phase of the thickness oscillation for the samples sintered at different temperatures.
Figure 6:
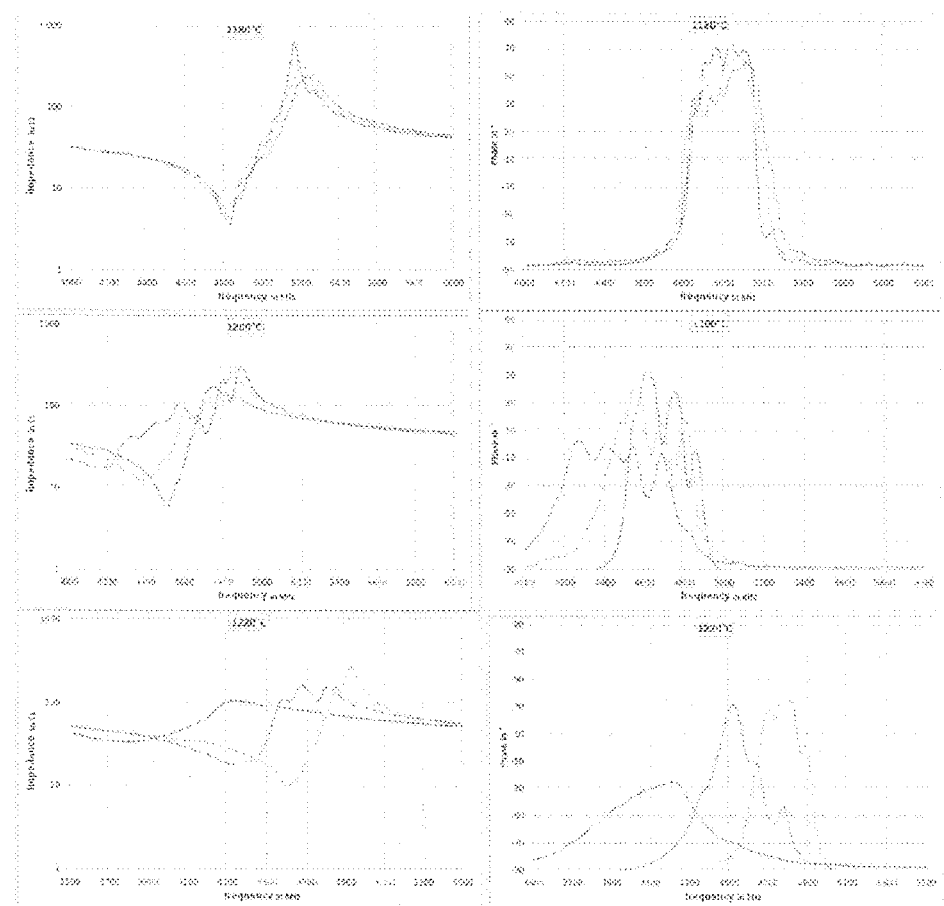

The depiction of the curve of impedance and phase of the thickness oscillation for the samples sintered at different temperatures (FIG. 6, samples 1a to 1f) discloses a relationship between structure and resonance behavior (3 individual samples are shown in each case). The material is characterized by strong variation of the curve profiles at the respective sintering temperature, strong variation of the curve profiles upon variation of the sintering temperature, and extremely disturbed resonance behavior at higher sintering temperatures.

The data are summarized in Table 1.

It is therefore shown that none of the applied sintering temperatures results in sufficiently good and reproducible electrical or electromechanical values and the previous technology is not suitable for large-scale industrial production.

Comparable behavior is shown by samples 2*a*, 5*a*, 9*a*, 10*a*, 14, and 15, which are listed in Table 2 but do not fall in the scope of the claims.

TABLE 2

| No. | x | y | z | P addition | addition at | ρ in ppm | sintering temperature °C. | Density in g/cm³ | Structure | S | ε | tanδ × 10³ | kp | kt | Td in °C | ρ$_{is}$ in Ωm (RT) | ρ$_{is}$ in Ωm (150° C.) | S3 × 10³ | RT, 2 kV/mm I in A |
|---|---|---|---|---|---|---|---|---|---|---|---|---|---|---|---|---|---|---|---|
| 2a | 0.850 | 0.120 | 0.030 | | | 0 | 1160-1240 | 5.6 | 2 | S | 550 | 12 | 0 | 0 | 195 | 1.9E+10 | 5.7E+06 | 0.32 | 3.7E-07 |
| 5a | 0.850 | 0.120 | 0.030 | | | 0 | 1180-1220 | 5.6 | 2 | | 540 | 9 | 0.12 | 0.46 | 205 | 1.5E+11 | 9.5E+06 | 0.30 | 3.7E-07 |
| 9a | 0.770 | 0.200 | 0.030 | | | 0 | 1180-1220 | 5.6 | 1 | | 500 | 21 | 0.17 | 0.41 | 215 | 3.8E+10 | 1.1E+09 | 0.26 | 3.0E-07 |
| 10a | 0.970 | 0.030 | 0.000 | | | 0 | 1120-1180 | 5.7 | 2 | S | 360 | 11 | 0.20 | 0.40 | 195 | 2.3E+10 | 3.6E+06 | 0.18 | 3.0E-07 |
| 14 | 0.850 | 0.150 | 0.000 | | | 0 | 1160-1220 | 5.5 | 1 | | 530 | 19 | 0.14 | 0.40 | 235 | 9.9E+10 | 1.6E+08 | 0.26 | 3.0E-07 |
| 15 | 0.850 | 0.120 | 0.000 | | | 0 | 1160-1220 | 5.6 | 3 | | 440 | 9 | 0.11 | 0.46 | 235 | 1.3E+11 | 1.3E+07 | 0.25 | 2.0E-07 |
| 2b | 0.850 | 0.120 | 0.030 | PE169 | FM | 250 | 1160-1240 | 5.7 | 1 | | 750 | 27 | 0.16 | 0.42 | 180 | 3.8E+10 | 3.8E+09 | 0.34 | 5.0E-07 |
| 4 | 0.850 | 0.120 | 0.030 | PE169 | FM | 250 | 1160-1220 | 5.6 | 1 | | 670 | 22 | 0.16 | 0.42 | 200 | 5.7E+10 | 19.E+09 | 0.34 | 4.4E-07 |
| 6 | 0.850 | 0.120 | 0.030 | PE169 | FM | 500 | 1180-1220 | 5.6 | 1 | | 780 | 25 | 0.16 | 0.40 | 185 | 1.1E+11 | 7.6E+09 | 0.35 | 4.9E-07 |
| 7 | 0.850 | 0.180 | 0.030 | PE169 | FM | 250 | 1180-1220 | 5.7 | 1 | | 640 | 24 | 0.16 | 0.40 | 200 | 5.7E+10 | 3.8E+09 | 0.30 | 3.7E-07 |
| 8 | 0.850 | 0.120 | 0.030 | PE169 | FM | 250 | 1180-1220 | 5.7 | 1 | | 550 | 24 | 0.16 | 0.40 | 205 | 9.5E+10 | 9.5E+09 | 0.25 | 3.0E-07 |
| 9b | 0.770 | 0.200 | 0.030 | PE169 | FM | 250 | 1180-1220 | 5.6 | 1 | | 560 | 23 | 0.16 | 0.40 | 205 | 3.8E+10 | 3.8E+09 | 0.25 | 3.0E-07 |
| 14a | 0.850 | 0.150 | 0.000 | PE169 | FM | 250 | 1160-1220 | 5.7 | 1 | | 630 | 24 | 0.16 | 0.43 | 210 | 1.4E+11 | 5.5E+09 | 0.30 | 4.0E-07 |
| 2c | 0.850 | 0.120 | 0.030 | KDP | G | 115 | 1160-1220 | 3.7 | 2 | | 600 | 37 | 0.16 | 0.35 | 205 | 3.8E+09 | 9.5E+06 | 0.32 | 4.4E-07 |
| 2d | 0.850 | 0.120 | 0.030 | KDP | G | 225 | 1180-1220 | 5.7 | 2 | | 700 | 25 | 0.16 | 0.41 | 200 | 1.5E+10 | 5.7E+07 | 0.35 | 4.4E-07 |
| 2e | 0.850 | 0.120 | 0.030 | KDP | G | 285 | 1180-1220 | 5.7 | 1 | | 710 | 26 | 0.16 | 0.41 | 200 | 1.1E+11 | 3.8E+09 | 0.32 | 4.4E-07 |
| 2f | 0.850 | 0.120 | 0.030 | KDP | G | 570 | 1180-1220 | 5.7 | 1 | | 740 | 28 | 0.16 | 0.41 | 195 | 1.1E+11 | 1.9E+09 | 0.31 | 4.8E-07 |
| 2g | 0.850 | 0.120 | 0.030 | KDP | G | 1140 | 1180-1220 | 5.7 | 1 | | 770 | 26 | 0.15 | 0.39 | 190 | 1.1E+11 | 3.8E+09 | 0.30 | 5.2E-07 |
| 2h | 0.850 | 0.120 | 0.030 | KDP | G | 1705 | 1180-1220 | 5.7 | 1 | | 780 | 27 | 0.15 | 0.37 | 185 | 7.6E+10 | 4.7E+09 | 0.30 | 5.2E-07 |
| 21 | 0.850 | 0.120 | 0.030 | KDP | G | 2275 | 1180-1220 | | 0 | | | | | | | | | | |
| 3 | 0.850 | 0.120 | 0.030 | KDP | G | 285 | 1160-1220 | 5.6 | 1 | | 720 | 27 | 0.16 | 0.41 | 195 | 8.5E+10 | 6.5E+09 | 0.34 | 4.9E-07 |
| 5b | 0.850 | 0.120 | 0.030 | KDP | G | 455 | 1180-1220 | 5.7 | 1 | | 770 | 28 | 0.16 | 0.41 | 195 | 3.8E+10 | 1.7E+09 | 0.35 | 5.4E-07 |
| 10b | 0.970 | 0.030 | 0.000 | KDP | G | 115 | 1120-1180 | 5.8 | 2 | S | 330 | 11 | 0.19 | 0.40 | 195 | 1.4E+10 | 2.3E+06 | 0.19 | 3.0E-07 |
| 10c | 0.970 | 0.030 | 0.000 | KDP | G | 1140 | 1120-1180 | 5.8 | 1 | | 440 | 37 | 0.18 | 0.35 | 185 | 7.2E+10 | 1.2E+09 | 0.20 | 6.0E-07 |
| 10d | 0.970 | 0.030 | 0.000 | KDP | G | 1705 | 1120-1180 | 5.8 | 1 | | 460 | 40 | 0.16 | 0.31 | 180 | 5.7E+10 | 5.7E+08 | 0.18 | 7.0E-07 |
| 11 | 0.900 | 0.100 | 0.000 | KDP | G | 285 | 1160-1220 | 5.7 | 1 | | 740 | 32 | 0.15 | 0.42 | 195 | 1.6E+10 | 4.4E+09 | 0.35 | 5.3E-07 |
| 12 | 0.880 | 0.120 | 0.000 | KDP | G | 285 | 1160-1220 | 5.7 | 1 | | 690 | 25 | 0.16 | 0.42 | 210 | 1.3E+10 | 3.4E+09 | 0.32 | 5.2E-07 |
| 13 | 0.860 | 0.140 | 0.000 | KBP | G | 285 | 1160-1220 | 5.7 | 1 | | 630 | 24 | 0.16 | 0.41 | 225 | 3.0E+10 | 7.0E+08 | 0.30 | 5.1E-07 |
| 15a | 0.850 | 0.150 | 0.000 | KDP | G | 285 | 1160-1220 | 5.7 | 1 | | 610 | 23 | 0.16 | 0.42 | 230 | 7.2E+10 | 5.7E+09 | 0.30 | 3.0E-07 |
| 2j | 0.850 | 0.120 | 0.030 | ADP | G | 135 | 1180-1220 | 5.7 | 2 | | 690 | 35 | 0.16 | 0.41 | 200 | 7.6E+10 | 3.8E+10 | 0.35 | 4.2E-07 |
| 2k | 0.850 | 0.120 | 0.030 | ADP | G | 675 | 1180-1220 | 5.8 | 1 | | 820 | 25 | 0.16 | 0.41 | 175 | 7.6E+10 | 3.8E+09 | 0.35 | 5.4E-07 |
| 21 | 0.850 | 0.120 | 0.030 | ADP | G | 1345 | 1180-1220 | 5.8 | 1 | | 940 | 31 | 0.16 | 0.37 | 150 | 3.8E+10 | 5.7E+09 | 0.35 | 6.2E-07 |
| 2m | 0.850 | 0.120 | 0.030 | ADP | G | 2695 | 1180-1220 | | 0 | | | | | | | | | | |
| 2n | 0.850 | 0.120 | 0.030 | PE169 | VS | 570 | 1160-1220 | 5.7 | 1 | | 730 | 25 | 0.16 | 0.44 | 185 | 1.3E+11 | 3.0E+09 | 0.36 | 4.7E-07 |

The following exemplary embodiments show the behavior of compositions produced according to the invention.

Exemplary Embodiment 1:

The fundamental composition $0.85(Bi_{0.5}Na_{0.5})TiO_3$-$0.12BaTiO_3$-$0.03SrTiO_3$ was processed according to the flow chart (FIG. 1) and
- either a phosphoric dispersing agent was added during the fine grinding (PE169, producer Akzo Nobel)
- or potassium dihydrogen phosphate was introduced during the granulation by addition to the binder.

Samples 2i with 2275 ppm P (TP) and 2m with 2695 ppm P (ADP) were not processable in this manner.

As may be seen from the light microscopy structure recordings (FIG. 7, samples 2a to 2h), an addition according to the invention of phosphorus ≥250 ppm causes the creation of a homogeneous, fine-grained structure.

FIG. 8 (samples 2a, 2b, 2c, 2e, and 2g) shows a significant improvement of the compaction upon addition of quantities according to the invention of phosphorus ≥250 ppm.

In addition, a substantial increase of the specific insulation resistance is surprisingly shown at higher temperatures, by multiple orders of magnitude (FIG. 9, samples 2a to 2h). Sufficiently good, reproducible polarization of the samples is thus ensured from 250 ppm.

FIGS. 10a to 10e make it clear that with phosphorus proportions according to the invention ≥250 ppm, a substantial reduction of the sample current is to be noted even at higher temperatures. The operation of actuators is thus also possible at higher operating temperatures.

Figure 11:
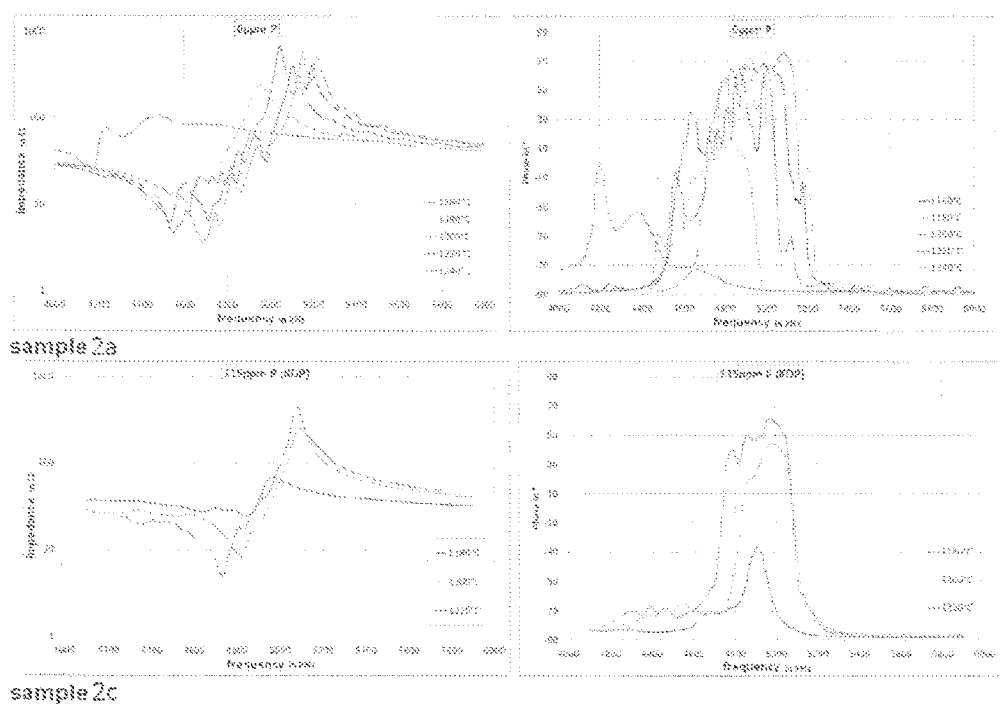
FIG. 11 are graphs which depict the characteristic resonance curves of the samples sintered at different temperatures.
Figure 11:
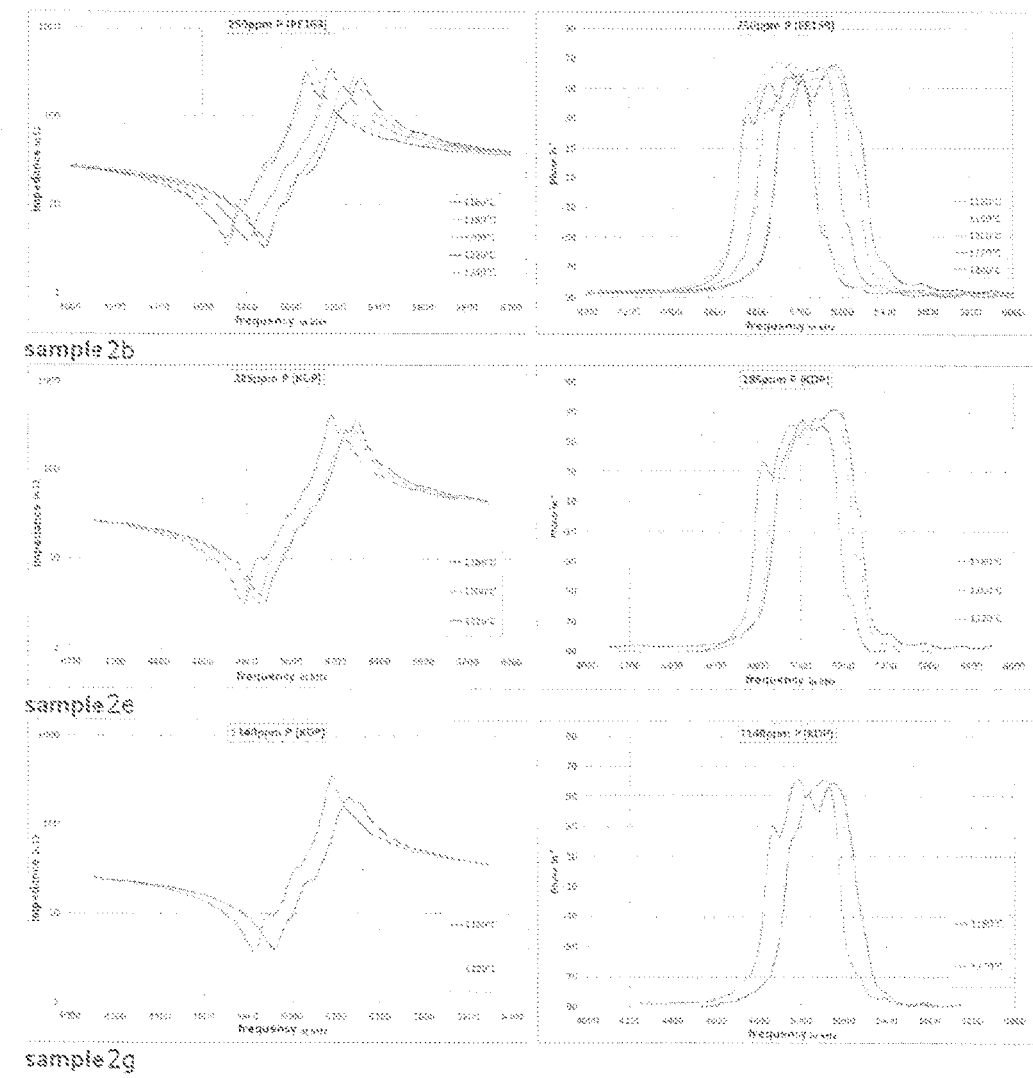

The variation of the sample properties is substantially reduced. If one observes characteristic resonance curves of the samples sintered at different temperatures it is thus noticeable that with phosphorus proportions according to the invention ≥250 ppm, the differences between the samples sintered at different temperatures are substantially reduced and therefore the sintering interval may surprisingly be broadened to a technologically usable, easily implementable temperature range (Tables 3a, 3b, FIG. 11).

Exemplary Embodiment 2:

Samples 3, 4, 5b, 6, and 2n according to Table 2 are further examples of the modification according to the invention, which is applicable in large-scale industrial processes, of the fundamental composition $0.85(Bi_{0.5}Na_{0.5})TiO_3$-$0.12BaTiO_3$-$0.03SrTiO_3$.

It can be seen as an essential technological advantage that in examples 3 and 5b, the material was processed without phosphorus up to the fine grinding and the phosphorus was first added during the slurrying for the spray granulation.

In examples 4, 6, the phosphorus addition was performed during the fine grinding, in example 2n during the organic slurrying for the film casting.

It is advantageous that the large-scale industrial material processing is performed uniformly up to the fine grinding independently of the primary shaping process (compression or film casting) and therefore the type and quantity of the phosphorus addition can be optimally adapted to the respective shaping process.

However, the possible combination of viscosity-determining phosphoric dispersing agents or binders and substantially "viscosity-neutral" additives such as KDP or ADP can also be advantageous.

FIGS. 13 and 14, sample 3, show the electromechanical elongation and the sample current in the temperature range from 25 to 150° C. for a composition according to the invention.

Exemplary Embodiment 3:

| No. | x | y | z | P addition | addition at | ρ in ppm |
|---|---|---|---|---|---|---|
| 7 | 0.850 | 0.120 | 0.030 | PE169 | FM | 250 |
| 8 | 0.790 | 0.180 | 0.030 | PE169 | FM | 250 |
| 9a | 0.770 | 0.200 | 0.030 | | | 0 |
| 9b | 0.770 | 0.200 | 0.030 | PE169 | FM | 250 |
| 10a | 0.970 | 0.030 | 0.000 | | | 0 |
| 10b | 0.9.70 | 0.030 | 0.000 | KDP | G | 115 |
| 10c | 0.970 | 0.030 | 0.000 | KDP | G | 1140 |
| 10d | 0.970 | 0.030 | 0.000 | KDP | G | 1705 |

TABLE 3a

| Sample 2b | ε | tanδ × 10³ | kp | kt | $ρ_{is}$ in Ωm (RT) | $ρ_{is}$ in Ωm (150° C.) | S3 × 10³ | I in A |
|---|---|---|---|---|---|---|---|---|
| 1160 | 750 | 29 | 0.16 | 0.40 | 2.0E+10 | 3.4E+09 | 0.36 | 6.3E−07 |
| 1180 | 730 | 27 | 0.17 | 0.42 | 3.8E+10 | 3.8E+09 | 0.34 | 5.0E−07 |
| 1200 | 750 | 27 | 0.17 | 0.41 | 2.0E+10 | 3.4E+09 | 0.34 | 5.4E−07 |
| 1220 | 770 | 27 | 0.16 | 0.42 | 2.6E+10 | 3.7E+09 | 0.32 | 5.9E−07 |
| 1240 | 730 | 27 | 0.16 | 0.42 | 2.0E+10 | 3.4E+09 | 0.32 | 5.9E−07 |

TABLE 3b

| Sample 2e | ε | tanδ × 10³ | kp | kt | $ρ_{is}$ in Ωm (RT) | $ρ_{is}$ in Ωm (150° C.) | S3 × 10³ | I in A |
|---|---|---|---|---|---|---|---|---|
| 1180 | 710 | 27 | 0.16 | 0.43 | 1.7E+11 | 5.1E+09 | 0.32 | 4.4E−07 |
| 1200 | 710 | 26 | 0.16 | 0.41 | 3.4E+10 | 1.3E+09 | 0.33 | 4.8E−07 |
| 1220 | 700 | 25 | 0.17 | 0.42 | 1.1E+11 | 3.8E+09 | 0.34 | 4.6E−07 |

Surprisingly, the depolarization temperature may be set in a broad range by selection of the phosphoric material. FIG. 12 (samples 2a, 2c to 2h, 2j to 2l) displays the depolarization temperature Td, for different phosphorus sources and proportions. The possibility is therefore opened up of varying the depolarization temperature specifically for the application.

-continued

| No. | x | y | z | P addition | addition at | ρ in ppm |
|---|---|---|---|---|---|---|
| 11 | 0.900 | 0.100 | 0.000 | KDP | G | 285 |
| 12 | 0.880 | 0.120 | 0.000 | KDP | G | 285 |
| 13 | 0.860 | 0.140 | 0.000 | KDP | G | 285 |
| 14 | 0.850 | 0.150 | 0.000 | | | 0 |
| 14a | 0.850 | 0.150 | 0.000 | PE169 | FM | 250 |

-continued

| No. | x | y | z | P addition | addition at | ρ in ppm |
|---|---|---|---|---|---|---|
| 15 | 0.850 | 0.150 | 0.000 | | | |
| 15a | 0.850 | 0.150 | 0.000 | KDP | G | 285 |

Excerpt from Table 2

In the range y≥0.10, the material system behaves similarly with respect to the phosphorus modification as the fundamental composition $0.85(Bi_{0.5}Na_{0.5})TiO_3$-$0.12BaTiO_3$-$0.03SrTiO_3$.

The range y<0.10 requires phosphorus proportions in the upper claimed value range.

The invention claimed is:

1. A lead-free piezoceramic material based on bismuth sodium titanate (BST) of the fundamental composition
$x(Bi_{0.5}Na_{0.5})TiO_3$-$yBaTiO_3$-$zSrTiO_3$ with x+y+z=1 and 0<x<1, 0<y<1, 0≤z≤0.07 or
$x(Bi_{0.5}Na_{0.5})TiO_3$-$yBaTiO_3$-$zCaTiO_3$ with x+y+z=1 and 0<x<1, 0<y<1, 0≤z≤0.05
characterized by the addition of a phosphoric material in a quantity such that the concentration of phosphorus in the piezoceramic material is 250 to 2000 ppm, wherein the specification ppm (parts per million) relates to the mass of phosphorus in relation to the total mass of the piezoceramic composition.

2. The lead-free piezoceramic material based on bismuth sodium titanate (BST) according to claim 1, wherein the fundamental composition is
$x(Bi_{0.5}Na_{0.5})TiO_3$-$yBaTiO_3$-$zSrTiO_3$ with y≥0.1 and x+y+z=1 or
$x(Bi_{0.5}Na_{0.5})TiO_3$-$yBaTiO_3$-$zCaTiO_3$ with y≥0.1 and x+y+z=1.

3. The lead-free piezoceramic material according to claim 1,
in that the phosphoric compound is an inorganic phosphate, hydrogen phosphate, or dihydrogen phosphate.

4. The lead-free piezoceramic material according to claim 1,
characterized in that the phosphoric compound is selected from the group which consists of $KH_2PO_4$, $(NH_4)H_2PO_4$.

5. The lead-free piezoceramic material according to claim 1,
characterized in that the phosphoric material is added in a quantity such that the concentration of phosphorus in the lead-free piezoceramic material is 270 to 1800 ppm.

6. The lead-free piezoceramic material according to claim 1,
characterized in that the fundamental composition contains additives in the form of oxides or complex perovskites.

7. A method for producing a lead-free piezoceramic material according to claim 1,
characterized by the following steps:
producing a raw material mixture of the fundamental composition,
producing a calcinate of the fundamental composition,
finely grinding the calcinate,
producing a granulate in particular by spray granulation or producing a casting slurry for the multilayer or "co-firing" process,
further processing in a known manner including sintering in normal atmosphere,
wherein phosphoric additives are added during the fine grinding or the spray granulation and/or during the preparation of casting slurries.

8. A piezoceramic multilayer actuator based on a lead-free piezoceramic material according to claim 1.

9. A piezoceramic component, preferably having at least one piezoceramic body having at least two electrodes, more preferably in the form of a piezoelectric ultrasonic transducer, based on a lead-free piezoceramic material according to claim 1.

10. A use of a phosphoric material in a piezoceramic material based on bismuth sodium titanate (BST) of the fundamental composition
$x(Bi_{0.5}Na_{0.5})TiO_3$-$yBaTiO_3$-$zSrTiO_3$ with x+y+z=1 and 0<x<1, 0<y<1, 0≤z≤0.07 or
$x(Bi_{0.5}Na_{0.5})TiO_3$-$yBaTiO_3$-$zCaTiO_3$ with x+y+z=1 and 0<x<1, 0<y<1, 0≤z≤0.05
to reduce the giant grain growth, wherein the phosphoric material is used in a quantity such that the concentration of phosphorus in the piezoceramic material is 250 to 2000 ppm,
wherein the specification ppm (parts per million) relates to the mass of phosphorus in relation to the total mass of the piezoceramic composition.

11. The use according to claim 10, wherein the fundamental composition is
$x(Bi_{0.5}Na_{0.5})TiO_3$-$yBaTiO_3$-$zSrTiO_3$ with y≥0.1 and x+y+z=1 or
$x(Bi_{0.5}Na_{0.5})TiO_3$-$yBaTiO_3$-$zCaTiO_3$ with y≥0.1 and x+y+z=1.

12. The use according to claim 10,
characterized in that the phosphoric compound is an inorganic phosphate, hydrogen phosphate, or dihydrogen phosphate.

13. The use according to claim 10,
characterized in that the phosphoric compound is selected from the group which consists of $KH_2PO_4$, $(NH_4)H_2PO_4$.

14. A use of a phosphoric material in a piezoceramic material based on bismuth sodium titanate (BST) of the fundamental composition
$x(Bi_{0.5}Na_{0.5})TiO_3$-$yBaTiO_3$-$zSrTiO_3$ with x+y+z=1 and 0<x<1, 0<y<1, 0<z<0.07
or
$x(Bi_{0.5}Na_{0.5})TiO_3$-$yBaTiO_3$-$zCaTiO_3$ with x+y+z=1 and 0<x<1, 0<y<1, 0<z<0.05
to reduce the giant grain growth, wherein the phosphoric material is used in a quantity such that the concentration of phosphorus in the piezoceramic material is 270 to 1800 ppm,
wherein the specification ppm (parts per million) relates to the mass of phosphorus in relation to the total mass of the piezoceramic composition.

* * * * *